United States Patent [19]

Tracey

[11] 3,996,501

[45] Dec. 7, 1976

[54] LOCKING ARRANGEMENT FOR A WATTHOUR METER ADAPTER ASSEMBLY

[75] Inventor: Robert W. Tracey, Clemson, S.C.

[73] Assignee: Sangamo Electric Company, Springfield, Ill.

[22] Filed: May 19, 1975

[21] Appl. No.: 578,501

[52] U.S. Cl. .............................. 317/105; 324/156; 220/324; 292/281; 339/39
[51] Int. Cl.² .......................................... H02B 9/00
[58] Field of Search ................... 324/156; 220/324; 292/281, 256, 256.5; 240/41.55; 174/52 R; 339/31 R, 31 B, 31 M, 39; 317/104, 105, 107, 109–111

[56] References Cited

UNITED STATES PATENTS

| 3,045,314 | 7/1962 | Miller | 220/324 |
| 3,544,848 | 12/1970 | Donewald | 317/107 |
| 3,636,498 | 1/1972 | McQuarrie | 317/105 |
| 3,868,041 | 2/1975 | Knize | 220/324 |

Primary Examiner—Gerald P. Tolin
Attorney, Agent, or Firm—Johnson, Dienner, Emrich & Wagner

[57] ABSTRACT

A locking arrangement for clamping a watthour meter to an assembly includes first and second locking members each having first end portions which engage an annular ridge of the watthour housing, offset portions which engage an annular ridge of the adapter housing and second ends which are secured to the adapter housing from a rearward surface of the adapter housing to make removal of the watthour meter from the adapter assembly more difficult.

8 Claims, 4 Drawing Figures

LOCKING ARRANGEMENT FOR A WATTHOUR METER ADAPTER ASSEMBLY

BACKGROUND OF THE INVENTION

1. Field of the Invention

The present invention relates to watthour meter adapter assemblies, and, more particularly, to a new and improved lock arrangement for securing a watthour meter to an adapter to make removal of the watthour meter from the assembly more difficult than is normally the case.

2. Description of the Prior Art

There are today in the field a large number of individual electrical service installations for residences, and the like, which have a two-wire service. The industry, in many instances, utilizes two-wire bottom connected watthour meters to measure the electrical power consumption. The ever increasing reliance of the consumer on electrical appliances in the home has resulted in an increased demand for electrical power, and the utilities recognize today that in the future, it will be necessary to replace many of the two-wire services with three-wire service. This, of course, also requires the installation of a new three-wire meter for electrical power measurement purposes.

In anticipation of the phasing out of two-wire systems over a period of years, the utilities would prefer in most cases to replace the two-wire meters with three-wire meters because of the relatively long life of the meters used in the field today, such three-wire meter being used to measure the power input over the two-wire lines until such time as conversion is ultimately made to a three-wire service. The utility industry, therefore, will frequently use a watthour meter adapter assembly which permits a modern socket-type watthour meter designed for three-wire service to be adapted for use in the measurement of the electrical power input over the two-wire service without requiring a change in the service wiring at the installation.

One such adapter assembly which may conveniently provide for such versatility and convertability includes a plurality of jaw-like contacts which electrically and mechanically cooperate with bayonet contacts formed on the watthour meter, and which are also directly connected to adjustable lug type terminals that connect the adapter to an electrical distribution system.

An annular clamping member clamps the watthour meter to the adapter assembly and maintains the bayonet contacts in engagement with the jaw-like contacts. A suitable locking mechanism tightens the clamping member in position. However, in known assemblies such locking mechanism is readily accessible from the front of the meter and thus easily released.

Since such adapter will accept either a three-wire or a two-wire instrument, an installer may inadvertently replace a three-wire meter with a two-wire meter under the assumption that a two-wire meter is normally required for two-wire service. In such instances, the meter will not provide a record of the electricity used by the consumer.

To prevent against such inadvertance, approaches have been undertaken in the field to frustrate the substitution of a two-wire watthour meter on an adapter assembly by making normal removal and substitution operations for the meter much more difficult to perform through the provision of a locking device which holds the meter in place on the adapter assembly. By increasing the difficulty needed to remove or substitute a meter to a point that is greater than would otherwise be expected, it is intended that the installer will be alerted to the fact that the installation includes a three-wire watthour meter, and therefore, the risk of replacement of the three-wire meter with a two-wire meter is substantially reduced.

One example of a prior art locking device for this purpose is disclosed in the U.S. Pat. No. 3,636,498 of Alexander McQuarrie wherein a watthour meter adapter assembly is provided with a ring-like clamping member which clamps a watthour meter base to the adapter assembly and an L-shaped latching device having a shaft portion which extends through an aperture in the clamping member to prevent its release. Such arrangement, however, is rather complicated and expensive in construction. Moreover, the dimensioning of the aperture in the clamping member and the shaft portion of the locking device may be critical to the assembly and removal of the locking mechanism as well as to accomplishing the intended purpose of preventing a serviceman from easily removing the watthour meter from the adapter base.

SUMMARY OF THE INVENTION

Therefore, it is an object of the present invention to provide a new and improved locking arrangement for a watthour meter adapter assembly which makes the removal of a watthour meter from the assembly relatively difficult.

Another object of the invention is to provide an improved locking arrangement that is intended to frustrate the substitution of a two-wire watthour meter in an assembly which includes a three-wire watthour meter which is adapted to measure power consumption for a two-wire service.

It is another object of the present invention to provide an improved locking arrangement for a watthour meter adapter assembly which is simple in construction and easily installed but difficult to remove so as to require disassembly of the watthour meter adapter assembly before the watthour meter may be removed from the assembly.

It is another object of the present invention to provide a locking arrangement for a watthour meter adapter assembly which is inexpensive to manufacture and reliable in use.

These and other objects are achieved by the present invention which has provided a new and improved locking arrangement for a watthour meter adapter assembly and, in particular, for an assembly employing a three-wire watthour meter which is used to measure power consumption in a two-wire service.

In accordance with a disclosed embodiment of the invention, the locking arrangement is employed in a watthour meter adapter assembly and includes at least one locking device which secures a watthour meter to an adapter assembly and frustrates the release of the meter from the assembly unless the entire assembly is removed from its normal mounting.

The locking device has first and second parallel extending end portions interconnected by a leg portion having an offset portion defining first and second opposing shoulder portions. One of the end portions engages a rim of the meter housing, and the shoulder portions engage opposing surfaces of an annular rim of the adapter assembly when the locking device is mounted on the watthour meter adapter assembly. The other end of the locking device is secured to a rearward wall of the adapter assembly by a suitable fastening means.

The locking arrangement may include a further locking device generally similar to the first locking device and having first and second parallel extending end portions interconnected by a leg portion which has an offset portion defining first and second opposing shoulders. One of the end portions engages the rim of the meter housing, and the shoulder portions engage the opposing side surfaces of the annular rim of the adapter assembly when the locking device is mounted on the watthour meter adapter assembly. The other end portion of the further locking device is secured to the adapter assembly by a suitable fastening means from the rear of the adapter assembly.

Since the watthour meter adapter assembly, when installed, is arranged such that the rearward wall of the adapter is virtually flush against the mounting surface, then to remove the watthour meter from the assembly, the serviceman must demount the entire watthour meter adapter assembly to gain access to the fastening means which secure the locking devices to the adapter assembly. Inasmuch as such foregoing procedure is not the standard manner for changing a watthour meter, the serviceman is alerted to the fact that such installation is not usual. Accordingly, the serviceman will be more likely to notice that the installation includes a three-wire meter, and that the three-wire meter should not be replaced with a two-wire meter.

These and other objects, features, and advantages of the present invention will become readily apparent upon a detailed reading of a preferred embodiment of the present invention when viewing the accompanying drawings.

DESCRIPTION OF PREFERRED EMBODIMENTS

Figure 1:
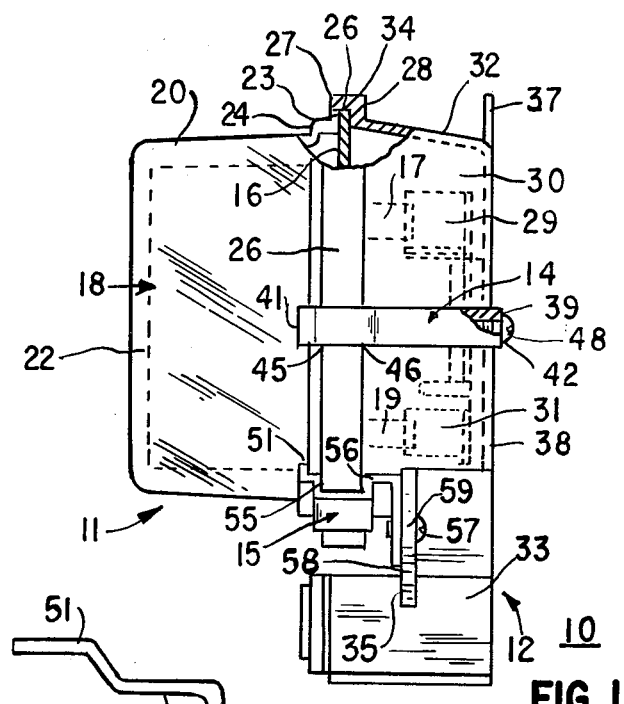
FIG. 1 is a side elevational view, partly in section, showing structural detail of a watthour meter adapter assembly which employs new and improved locking devices provided by the present invention.

Referring to FIG. 1, there is shown a watthour meter adapter assembly 10 including a conventional watthour meter 11 which is mounted on an adapter assembly 12 and secured thereto by a pair of locking members 14 and 15, provided in accordance with one embodiment of the present invention, which lock the watthour meter 11 to the adapter assembly 12 in a manner which makes the removal of the watthour meter 11 from the adapter assembly 12 difficult.

By way of illustration of the invention, it is assumed that the watthour meter 11 includes a conventional three-wire metering mechanism 18, which is operatively connected to a two-wire line of a power distribution system over the adapter assembly 12 to permit monitoring of power consumption over two-wire electrical power lines.

The watthour meter assembly 11 basically includes a generally circular and relatively flat meter base member 16 on which the metering mechanism 18 is mounted. A protective housing 20, which surrounds the metering mechanism 18, has an annular edge 23 mounted on the base member 16 in sealed relationship in a manner known in the art. The protective housing 20, which is of glass or some other suitable material, has an annular ridge or rim 24 formed adjacent the annular edge 23.

The metering mechanism 18 of the watthour meter 11 includes a plurality of bayonet contacts, two of which are shown in FIG. 1 as contacts 17 and 19, which permit the metering mechanism 18 to be connected to a power distribution system over the adapter assembly 12. The contacts 17 and 19 are electrically connected in operating relationship with the metering mechanism 18 and are mounted so as to extend through the base member 16 to project outwardly therefrom as illustrated in phantom in FIG. 1.

Figure 4:
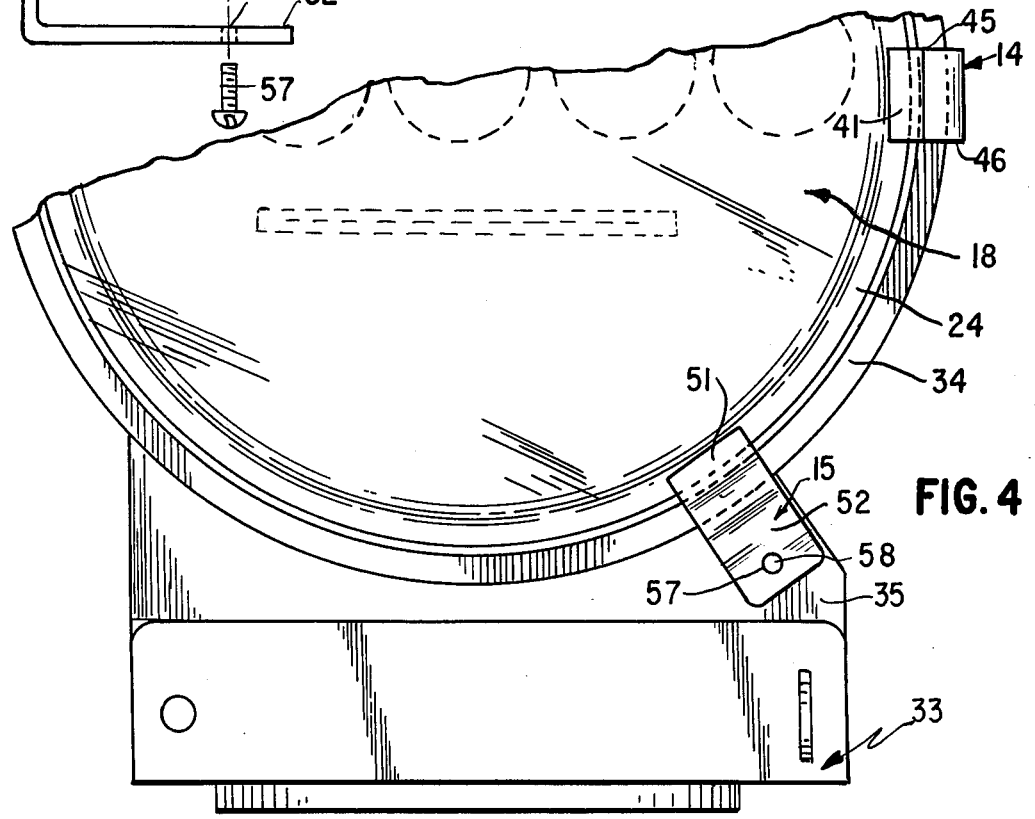

The adapter assembly 12 includes a suitable insulating housing 30 generally defined by a side wall portion 32 terminating in a forward circular peripheral rim 34 which defines an internal shoulder 26 on which rests an annular edge of the meter base member 16 when the meter assembly 11 is mounted on the adapter assembly 12. The adapter housing 30 has a rearward wall portion 38 integrally connected to the side wall portion 32. The adapter housing 30 contains a plurality of flexible jaw-like contacts 29 and 31, which are mounted on an interior wall of the housing 30 in any suitable manner and adapted to receive one of the bayonet contacts 17 and 19 of the meter assembly 11. The jaw-like contacts 29 and 31 are in turn connected to suitable lug-type terminals (not shown) which are mounted within a terminal box portion 33 of the adapter assembly 12 which permits connection to electrical power lines in a manner known in the art. One example of such contact assembly is illustrated in U.S. Pat. No. 3,636,498, referenced above. Referring to FIGS. 1 and 4, the terminal box portion 33 is formed as an extension of the adapter housing 30 and is connected to the housing 30 over a forward wall portion 35.

The rearward wall 38 of the adapter housing 30 includes a mounting lug or hanger 37 which is adapted to receive suitable fastener element (not shown) to permit the watthour meter assembly 10 to be secured to a wall or other mounting surface so that the face 22 of the metering mechanism 18 projects outwardly from the wall.

In accordance with one embodiment of the present invention, the locking members 14 and 15 secure the meter assembly 11 to the adapter housing 12 in a predetermined fixed position relative to the adapter assembly 12 so that the bayonet contacts 17 and 19 of the meter assembly 11 are held in firm engagement with the jaw-like contacts 29 and 31 of the adapter assembly 12 when the meter 11 is mounted in operating position on the assembly 12. Moreover, the locking members 14 and 15, provided by the present invention, lock the watthour meter 11 to the adapter assembly 12 to make more difficult the removal of the meter 11 from the adapter assembly 12 and to thereby frustrate the inadvertent substitution of a two-wire meter for the three-wire meter 18.

Figure 2:
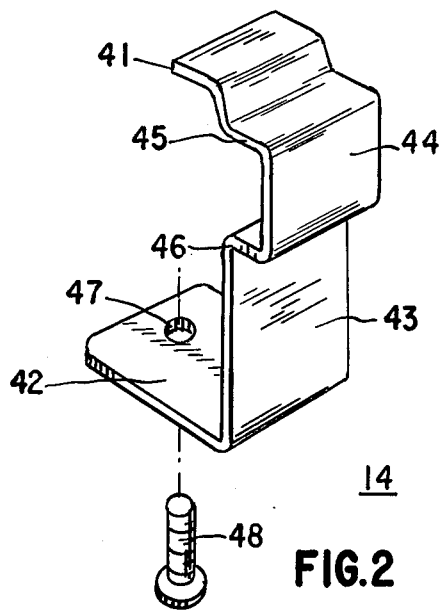
FIG. 2 is a perspective view of a locking device employed in the assembly shown in FIG. 1.

Referring to FIG. 2, locking member 14 comprises a generally U-shaped member having parallel extending end portions 41 and 42 interconnected by a leg portion 43 which has an offset portion 44 defining a pair of shoulders 45 and 46. The end portion 42, which permits the locking device 14 to be secured to the adapter housing 30, has an aperture 47 formed therein for receiving a suitable threaded fastening member, such as a screw 48. The locking member 14 is preferably fabricated from a metallic material of suitable strength and rigidity to securely clamp together the watthour meter 11 and the adapter assembly 12.

As best seen in FIG. 1, when the locking member 14 is mounted on the assembly 10, the end 41 engages the rim 24 of the meter housing 20, and the shoulder portions 45 and 46 engage respective surfaces 27 and 28 of the rim 34 of the housing 30 such that the meter 11 is clamped to the adapter assembly 12. The mounting end 42 of the locking member 14 extends along the rear wall 38 of the adapter housing 30 and is maintained in position by the screw 48 which is inserted through the aperture 47 in the mounting end 42 of the member and is in threaded engagement with a tapped hole 39 in the rear wall 38 of the adapter housing 30.

Figure 3:
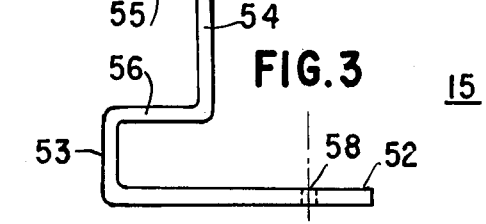
FIG. 3 is a side view of a further locking device employed in the assembly shown in FIG. 1; and, FIG. 4 is an enlarged, fragmentary, front view of the watthour meter adapter assembly shown in FIG. 1.

Referring to FIGS. 3 and 4, the locking member 15 is generally similar to locking member 14 and is circumferentially spaced therefrom along the rim 34 of the adapter housing 30. The use of two locking members provides a better locking arrangement than when only one locking member is employed. In addition, the relatively close spacing of the two locking members 14 and 15, that is within one quarter of the periphery of the annular rim 34 of the adapter housing 30 also directs attention of a serviceman to the non-standard locking arrangement. The locking member 15 includes parallel extending end portions 51 and 52. End 52 extends in the opposite generally transverse direction to the corresponding end portion 42 of the member 14 and tapped hole 58 formed therein which permits the locking member 15 to be secured to the forward wall 35 of the adapter housing 30 by way of a fastening member, such as a screw 57. The portion of leg 53 of locking member 15 which is intermediate the offset portion 54 and the end 52 is reduced somewhat in length relative to the comparable portion of the locking member 14 to permit the locking member 15 to fit between the lower surface 28 of the annular rim 34 and the forward wall portion 35 of the adapter housing 30 as shown in FIG. 1. The locking member 15 is also formed of a suitable metallic metal of a strength and rigidity which will serve to securely clamp the watthour meter 11 to the adapter assembly 12.

Referring to FIGS. 1 and 4, when the locking member 15 is mounted on the assembly 10, end portion 51 engages the rim 24 of the meter housing 20 and the shoulder portions 55 and 56 engage surfaces 27 and 28 of the annular rim 34 of the housing 30 to further clamp the meter 11 to the adapter assembly 12. The mounting end portion 52 extends generally along the forward wall 35 of the adapter housing 30 with the tapped hole 58 disposed adjacent aperture 59 in the forward wall 35. As shown in FIG. 1, the screw 57, which secures the locking member 15 to the forward wall portion 35 of the adapter assembly 12, is inserted through aperture 59 from the rear of the adapter housing 30 in threaded engagement with the tapped hole 58 in the mounting end 52 of the locking member 15.

To assemble the locking members 14 and 15, the locking member 14 is located at the side of the assembly 10, as shown in FIG. 4, with the end 41 engaging the ledge 24 of the meter housing 20, positioning the shoulders 45 and 46 to engage the opposing sides 27 and 28 of the annular rim 34 of the housing 30 so that the mounting leg portion 42 extends along the rear wall 38 of the adapter housing 12 with aperture 47 disposed adjacent the tapped hole 39 in the housing wall 38. The screw member 48 is then inserted through aperture 47 and tightened into threaded engagement with tapped hole 39 to secure the locking device 14 to the assembly 10.

Locking member 15 is then secured to the adapter assembly 12 in a similar manner by locating the end 51 over the ledge 24 of the meter housing 20 and positioning the shoulders 55 and 56 to engage opposing sides 27 and 28 of the rim 34 so that the mounting leg portion 52 extends along the forward wall 35 of the adapter 12 with the tapped hole 58 of member 15 being disposed adjacent the aperture 59 in the forward wall 35. The screw member 57 is then inserted through aperture 59 and tightened into threaded engagement with tapped hole 58 to secure the locking member 15 to the adapter assembly 12.

When the watthour meter adapter assembly 10 is mounted on a suitable mounting surface or wall by way of the hanger 37, the rear wall 38 of the adapter 12 is disposed adjacent the mounting surface thereby limiting access to the locking screws 48 and 57. Accordingly, the locking members 14 and 15 serve to frustrate disassembly of the watthour meter 11 from the adapter assembly 12 inasmuch as when the locking members 14 and 15 are assembled on the watthour meter adapter assembly 10, the screws 48 and 57 are disposed rearwardly of the adapter housing 30.

Thus, it will be appreciated that the locking devices 14 and 15 cannot be removed from the assembly 10 without first removing the entire assembly 10 from its normal mounting position. Since with the present embodiment, the entire watthour adapter assembly 10 has to be removed from the wall before the watthour meter 11 can be easily removed from the adapter assembly 12, a serviceman is alerted to this rather non-standard service procedure, and is therefore much more apt to closely inspect the installation being serviced. By doing so, the ordinary serviceman should become aware of the fact that the arrangement includes a three-wire watthour meter mechanism which is connected to monitor power consumption over a two-wire system. Consequently, the likelihood that the servicemen would, through mere custom and repetition, replace a three-wire watthour mechanism with a conventional two-wire watthour meter mechanism in a two-wire system is significantly diminished if not completely eliminated.

While in the exemplary embodiment, shown in FIG. 4, the locking members 14 and 15 are located in a circumferentially spaced relationship over a one-fourth of the periphery of the annular rim 34 of the adapter housing 30, it will of course be understood that various other circumferential spacings may be used. Moreover, in some applications, it may be desirable to employ more than two locking members.

Alternatively, two locking members having the configuration of locking member 14 shown in FIG. 2, may be used to secure the meter 11 to the adapter assembly 12, one of the locking members being positioned in the manner of locking member 14 as shown in FIG. 4, and the other locking member (not shown) being positioned diametrically opposed to the other locking member. Both locking members secure the meter 11 to the adapter assembly 12 in the manner described above for locking member 14. In this alternative embodiment, locking member 14 is not used.

Although the locking arrangement has been principally disclosed for use in inhibiting the inadvertant substitution, by a serviceman, of a two-wire watthour meter for a three-wire watthour meter, it is well within the purview of the present invention that the locking arrangement may serve additional functions which tend to render quick servicing of a watthour metering mechanism appreciably difficult.

It is believed apparent from the foregoing that the locking arrangement of the present invention is simple in construction, reliable in use, and enables one to effectively make normal watthour non-standard servicing procedures virtually impossible so as to thereby alert a serviceman that the particular installation being serviced is not standard and that care should be exercised in the servicing of such installation.

I claim:

1. In a watthour meter adapter assembly including a watthour meter having a housing with an annular rim portion and a base member secured to said housing adjacent said annular rim portion, and an adapter assembly including a housing having a rear wall and an annular shoulder portion along its front wall mounting said watthour meter, a locking arrangement detachably securing said watthour meter to said adapter assembly comprising at least one locking member having first and second parallel extending end portions and a rigid leg portion interconnecting said end portions, said first end portion engaging said rim portion of said meter housing, and said second end portion extending along the rear wall of said adapter housing to urge said first end toward said adapter housing to thereby clamp said meter housing to said adapter assembly, and means securing said second end portion to the rear wall of said adapter housing, said means being disposed between said rearward wall of said adapter housing and a mounting surface when said assembly is mounted on said mounting surface to thereby prevent removal of said meter from said adapter assembly while said assembly is mounted on said mounting surface.

2. An assembly as set forth in claim 1 wherein said adapter housing includes a peripheral rim portion defining said annular shoulder portion, said peripheral rim portion having opposing surfaces disposed substantially parallel to said annular rim portion of said meter housing, said leg portion of said locking member including an offset portion defining first and second opposing shoulders which engage said opposing surfaces of said adapter housing annular rim portion to lock said meter housing to said adapter assembly.

3. An assembly as set forth in claim 2 wherein said second end of said locking member has a first aperture formed therein which is disposed adjacent a tapped aperture in the rearward wall of said adapter housing and wherein said means for securing said second end portion comprises a screw member having a threaded shank portion which passes through said first aperture and threadingly engages said tapped aperture to thereby secure said second end portion to said rearward wall of said adapter housing.

4. An assembly as set forth in claim 1 wherein said locking arrangement includes a second locking member circumferentially spaced from said one locking member along said annular rim portion of said meter housing.

5. An assembly as set forth in claim 4 wherein said second locking member has third and fourth parallel extending end portions and a rigid leg portion interconnecting said ends, said third end portion engaging said rim portion of said meter housing, and said fourth end portion extending along a forward wall of said adapter housing, and second means for securing said fourth end portion to said forward wall of said adapter housing.

6. An assembly as set forth in claim 5 wherein said fourth end portion of said second locking member has a tapped aperture formed therein adjacent an aperture in said forward wall portion of said adapter housing and wherein said second means comprises a screw member having a threaded shank portion which extends through said aperture in said adapter housing and threadingly engages said tapped aperture in said fourth end portion of said second locking member.

7. An assembly as set forth in claim 5 wherein said first and second locking devices are circumferentially spaced along the annular rim of said meter housing within one-fourth of the circumference of said annular rim.

8. In a watthour meter adapter assembly including a watthour meter having a housing with an annular rim portion, a base member secured to said housing adjacent said rim portion and an adapter assembly including an adapter housing having a rear wall and an annular peripheral rim portion defining a shoulder portion along its front wall mounting said meter assembly, a locking arrangement detachably securing said watthour meter to said adapter assembly comprising a first locking member having first and second parallel extending end portions and a rigid leg portion interconnecting said end portions, said leg portion having an offset portion defining first and second opposing portions which engage opposing surfaces of said peripheral rim of said adapter housing, said first end portion engaging said annular rim of said meter housing and said second end portion extending along the rear wall of said adapter housing to urge said first end toward said adapter housing to thereby clamp said meter housing to said adapter housing, and first means securing said second end portion to the rear wall of said adapter housing, and a second locking member circumferentially spaced from said first locking member along the periphery of said annular rim of said adapter housing, said second locking member having third and fourth parallel extending end portions and a leg portion interconnecting said third and fourth end portions, said leg portion having an offset portion defining third and fourth shoulder portions which engage said opposing surfaces of said peripheral rim of said adapter housing, said third end portion engaging said annular rim of said meter housing, and said fourth end portion extending along a forward wall of said adapter housing, and second means securing said fourth end portion to said forward wall of said adapter housing rearwardly of said adapter housing whereby said second locking member further secures said meter housing to said adapter housing.

* * * * *